(12) United States Patent
Garcia

(10) Patent No.: US 7,276,396 B2
(45) Date of Patent: Oct. 2, 2007

(54) DIE HANDLING SYSTEM

(75) Inventor: Jason A. Garcia, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 434 days.

(21) Appl. No.: 10/959,931

(22) Filed: Oct. 6, 2004

(65) Prior Publication Data

US 2006/0073632 A1    Apr. 6, 2006

(51) Int. Cl.
*H01L 21/00* (2006.01)
(52) U.S. Cl. .................. 438/106; 438/108; 438/110; 438/113; 257/778; 257/782; 156/510
(58) Field of Classification Search ............... 438/106, 438/108, 110, 113; 257/778, 782
See application file for complete search history.

(56) References Cited

U.S. PATENT DOCUMENTS

| | | | | |
|---|---|---|---|---|
| 5,399,898 A | * | 3/1995 | Rostoker | 257/499 |
| 5,755,373 A | * | 5/1998 | Nakamura | 228/6.2 |
| 5,829,128 A | * | 11/1998 | Eldridge et al. | 29/855 |
| 5,904,497 A | * | 5/1999 | Akram | 438/106 |
| 5,937,270 A | * | 8/1999 | Canella | 438/14 |
| 5,986,235 A | * | 11/1999 | Canella | 219/121.68 |
| 6,417,484 B1 | * | 7/2002 | Canella et al. | 219/121.68 |
| 6,555,418 B2 | * | 4/2003 | Kurosawa et al. | 438/118 |
| 6,760,968 B2 | * | 7/2004 | Mimata et al. | 29/740 |
| 6,792,365 B2 | * | 9/2004 | Raitter | 702/81 |
| 7,045,035 B1 | * | 5/2006 | Kelkar et al. | 156/344 |
| 7,126,224 B2 | * | 10/2006 | Akram | 257/774 |
| 7,129,114 B2 | * | 10/2006 | Akram | 438/110 |
| 2002/0132501 A1 | * | 9/2002 | Eldridge et al. | 439/66 |
| 2002/0196598 A1 | * | 12/2002 | Momenpour et al. | 361/679 |
| 2003/0099097 A1 | * | 5/2003 | Mok et al. | 361/767 |
| 2004/0244915 A1 | * | 12/2004 | Lam et al. | 156/510 |
| 2005/0130333 A1 | * | 6/2005 | Zhong et al. | 438/16 |
| 2005/0198799 A1 | * | 9/2005 | Gaunekar et al. | 29/426.3 |
| 2005/0274457 A1 | * | 12/2005 | Cheung et al. | 156/344 |

* cited by examiner

*Primary Examiner*—Michael Lebentritt
*Assistant Examiner*—Abdulfattah Mustapha
(74) *Attorney, Agent, or Firm*—Buckley, Maschoff & Talwalkar LLC

(57) ABSTRACT

A system may include singulation of a semiconductor wafer to separate a plurality of integrated circuit die that are integrated into the semiconductor wafer; coupling of a support to an integrated circuit substrate of one of the plurality of integrated circuit die, and decoupling of the one integrated circuit die from the singulated semiconductor wafer while the support is coupled to the integrated circuit substrate. According to some embodiments, a second side of the one integrated circuit die is not touched during the coupling and the decoupling, the second side being opposite to the integrated circuit substrate.

12 Claims, 20 Drawing Sheets

DIE HANDLING SYSTEM

BACKGROUND

An integrated circuit (IC) die may include several elements that are susceptible to damage. For example, an IC die includes a semiconductor substrate and electrical devices that are integrated therewith. An IC die may also include interconnects and several thin layers of conductive paths, with each layer separated from adjacent layers by an interlayer dielectric (ILD).

After an IC die is fabricated, the IC die is manipulated for transport, for testing, and/or for attachment to an IC package. Such manipulation may present an unacceptable risk of damage to the IC die, particularly if the IC die includes delicate components such as low-k ILD material, compliant interconnects, and air bridge ILDs. This risk may compromise the reliability and/or quality of the IC die.

DETAILED DESCRIPTION

Figure 1:
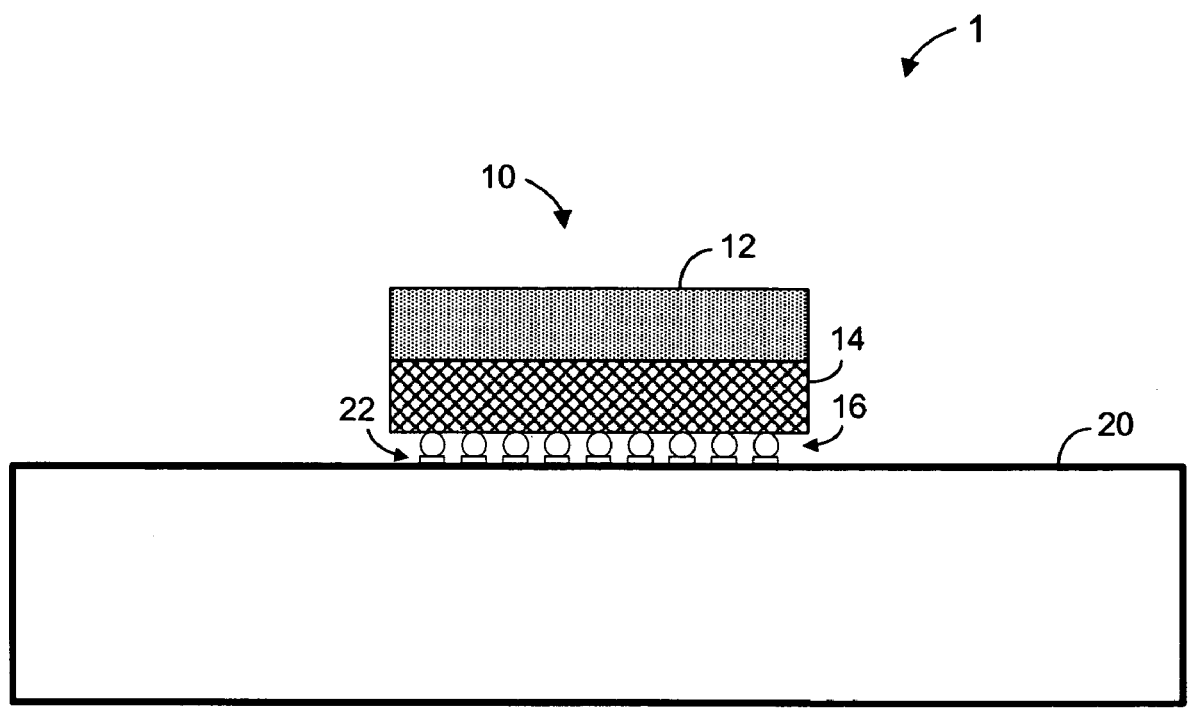
FIG. 1 is a side cross-sectional view of an integrated circuit die and a portion of an integrated circuit package.

FIG. 1 is a cross-sectional side view of system 1 according to some embodiments. Apparatus 1 includes IC die 10 coupled to IC package 20. IC die 10 may provide one or more functions. In some embodiments, IC die 10 comprises a microprocessor, a network processor, or a transceiver having a silicon substrate.

IC die 10 includes semiconductor substrate 12 and integrated electrical devices 14. Although FIG. 1 illustrates substrate 12 and devices 14 as occupying distinct layers of IC die 10, devices 14 may be integrated wholly or partially within substrate 12 according to some embodiments. IC die 10 may be fabricated using any currently- or hereafter-known suitable materials and fabrication techniques.

Electrical contacts 16 are coupled to IC die 10 and may be electrically coupled to one or more of electrical devices 14. Electrical contacts 16 may comprise any currently- or hereafter-known electrical contacts, including but not limited to Controlled Collapse Chip Connect (C4) solder balls or compliant interconnects. Electrical contacts 16 may be disposed on IC die 10 in any suitable arrangement.

Electrical contacts 16 are shown coupled to electrical contacts 22 of IC package 20. IC package 20 may comprise any ceramic, organic, and/or other suitable material. In some embodiments, die 10 is electrically coupled to IC package 20 via wirebonds in addition to or as an alternative to electrical contacts 16.

IC package 20 may comprise multiple stacked layers of dielectric material that are separated by planes of conductive traces. Conductive traces of one plane may be coupled to electrical contacts 16 and/or to conductive traces of one or more other planes by vias fabricated within the layers of dielectric material. The conductive traces of IC package 20 may also be coupled to other external electrical contacts (not shown) for carrying power and I/O signals between elements of system 1 and external devices. For example, the external electrical contacts may comprise through hole pins that may be mounted directly to a motherboard (not shown) or onto a socket that is in turn mounted directly to a motherboard. Alternative electrical contacts such as solder balls may be used to connect IC package 20 to a motherboard, a socket, or another substrate.

Figure 2A:
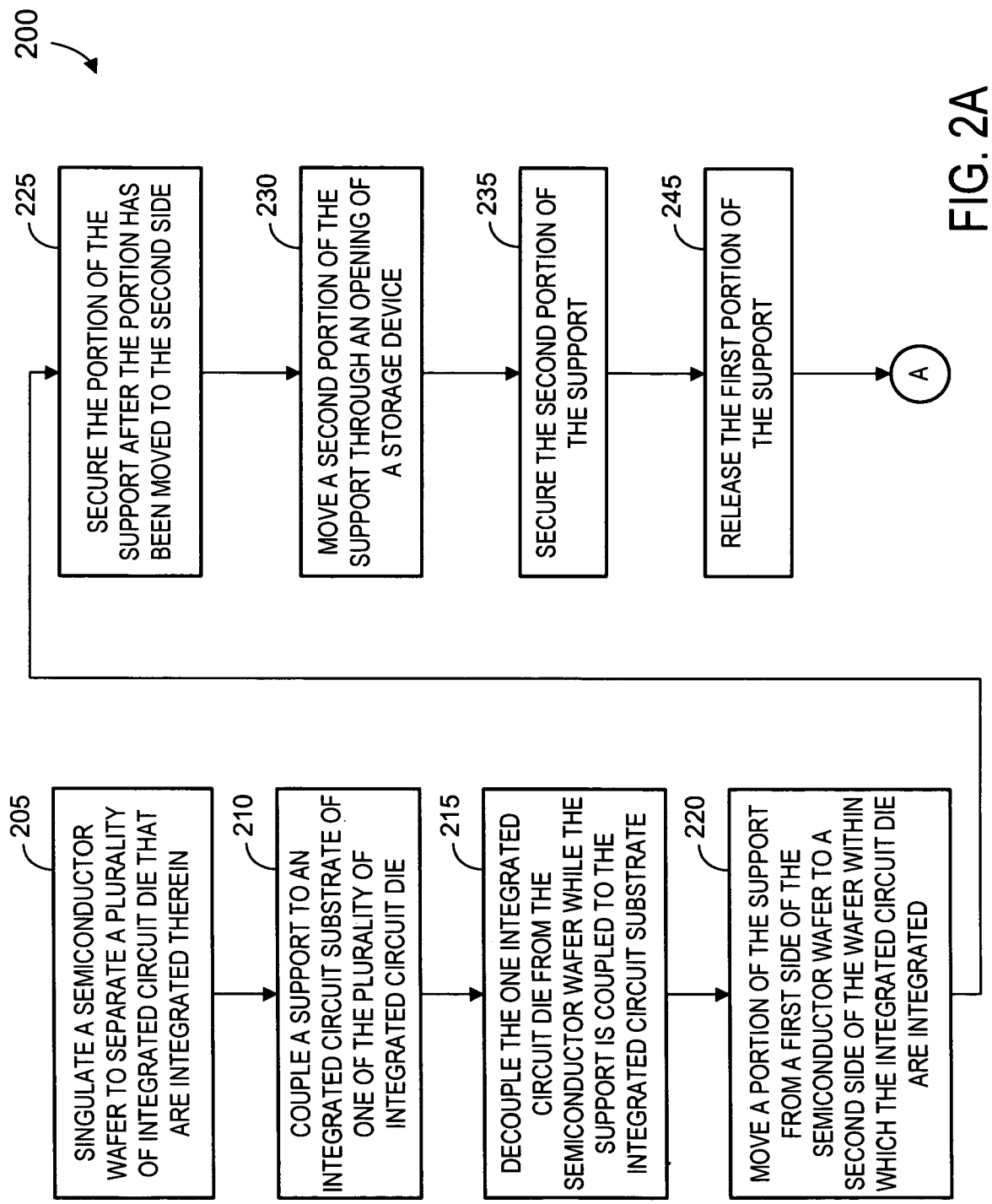
FIGS. 2A and 2B comprise a diagram of a process according to some embodiments.
Figure 2B:
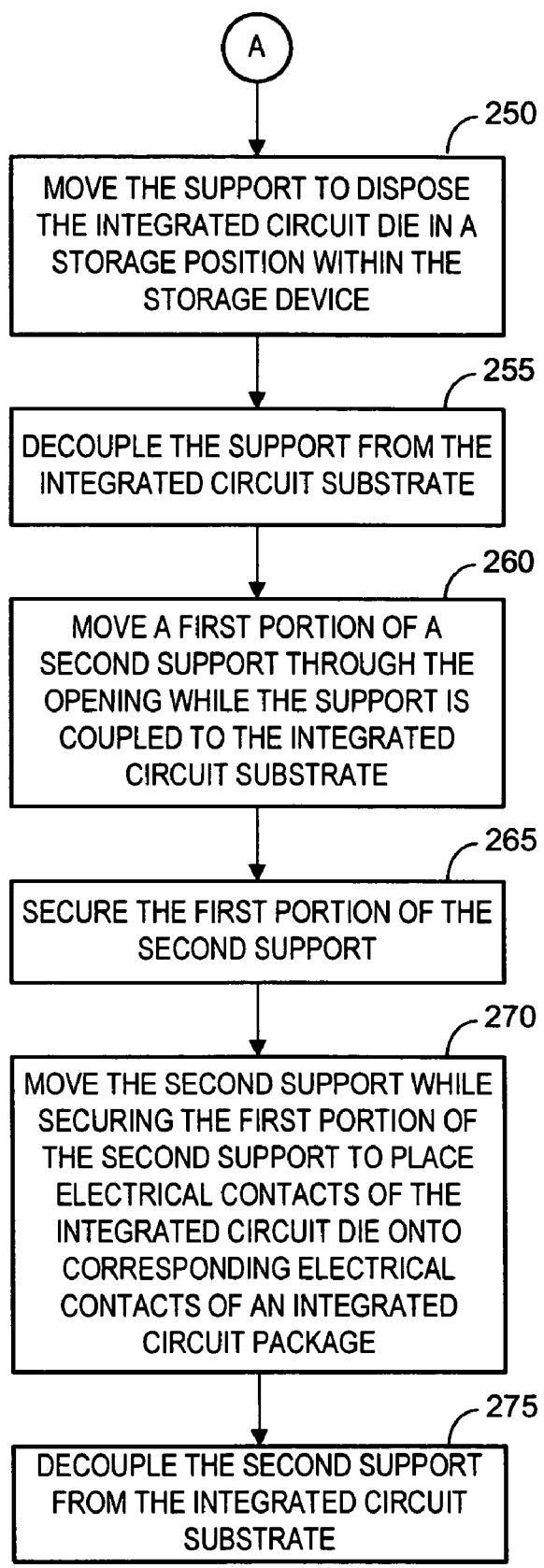

FIGS. 2A and 2B comprise a diagram of process 200 to fabricate system 1 according to some embodiments. Process 200 may be executed by one or more devices, in one or more locations, and/or by one or more entities. All or a part of process 200 may be executed manually.

Briefly, some embodiments of process 200 include singulating a semiconductor wafer to separate a plurality of IC die that are integrated into the semiconductor wafer, coupling a support to an IC substrate of one of the plurality of IC die, and decoupling the one IC die from the singulated semiconductor wafer while the support is coupled to the IC substrate. According to some embodiments, a second side of the one integrated circuit die is not touched during the coupling and the decoupling, the second side being opposite to the integrated circuit substrate. In some embodiments, the support is coupled to the integrated circuit substrate by moving the support into an opening defined by a material for coupling the semiconductor wafer to a base.

Figure 3:
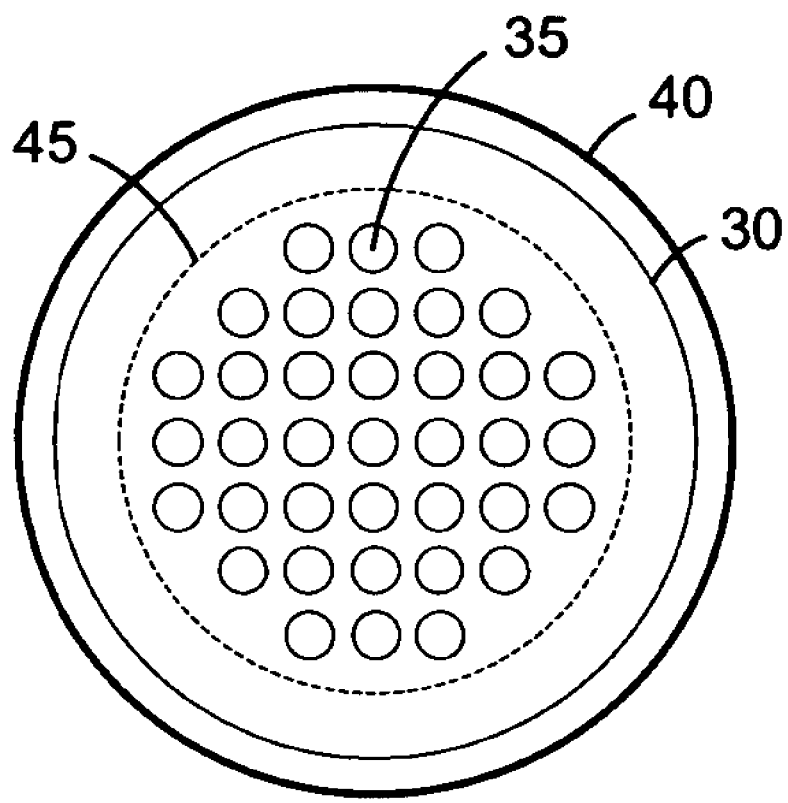
FIG. 3 is a top view of a wafer handling ring and a material according to some embodiments.
Figure 4:
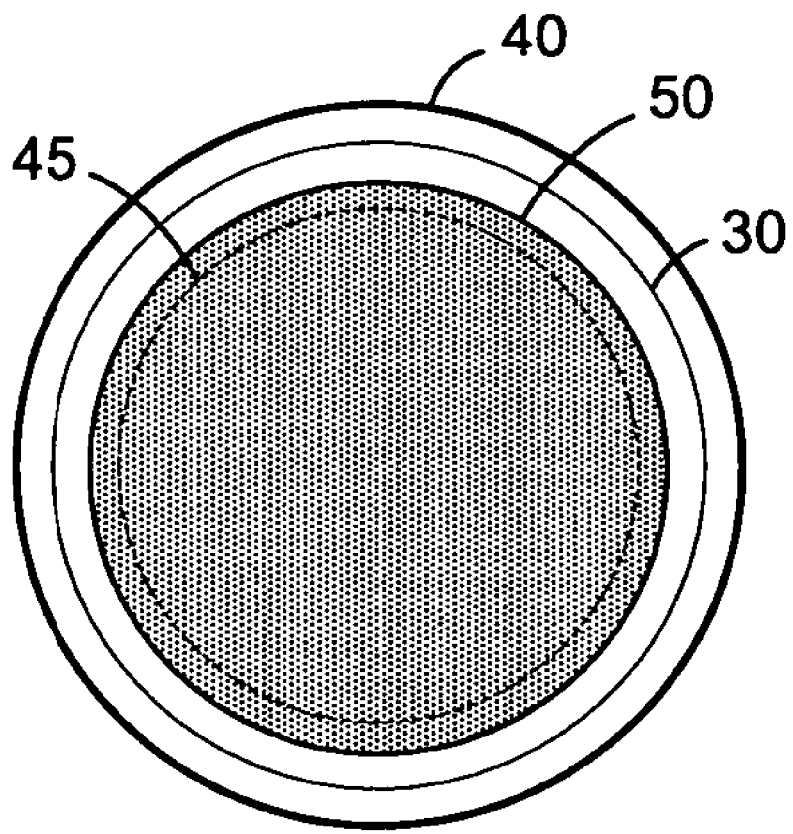
FIG. 4 is a top view of a semiconductor wafer, a handling ring, and a material according to some embodiments.

Process 200 begins at 205, in which a semiconductor wafer is singulated to separate a plurality of IC die that are integrated therein. Accordingly, the plurality of IC die are integrated within the semiconductor wafer prior to process 200. FIGS. 3 and 4 illustrate fabrication of the plurality of IC die according to some embodiments.

Specifically, FIG. 3 is a top view of material 30 after being placed on handling ring 40. Dotted line 45 illustrates an inner diameter of handling ring 40. Material 30 may comprise any suitable material for coupling a semiconductor wafer to ring 40. Material 30 defines openings 35 that may be formed before or after material 30 is placed on ring 40. In some embodiments, material 30 is purchased with openings 35 predefined therein.

FIG. 4 is a top view of the FIG. 3 structure after semiconductor wafer 50 has been placed thereon. Material 30 may comprise a double-sided adhesive material that adheres to handling ring 40 and to semiconductor wafer 50. Semiconductor wafer 50 may comprise any currently- or hereafter known material or materials into which electrical devices may be integrated. Semiconductor wafer 50 may be placed onto material 30 such that openings 35 are aligned with areas on wafer 50 in which a plurality of IC die will be fabricated. According to some embodiments, openings 35 are formed after wafer 50 is placed on material 30. The plurality of IC die may be formed on wafer 50 according to any currently- or hereafter-known fabrication technique.

Figure 5:
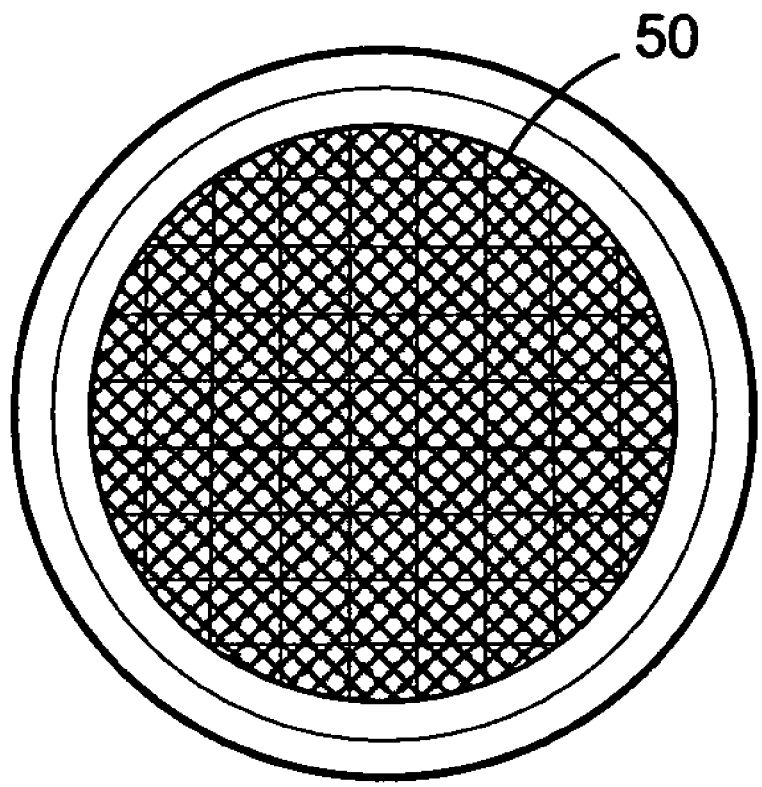
FIG. 5 is a top view of a singulated semiconductor wafer, a handling ring, and a material according to some embodiments.

Returning to process 200, FIG. 5 is a top view of the FIG. 4 structure after the plurality of IC die have been fabricated and singulated according to some embodiments of 205. The illustrated surface of wafer 50 therefore includes electrical devices. The lines shown on wafer 50 represent where wafer 50 was singulated in order to separate a plurality of IC die formed therein. Singulation at 205 may proceed using any currently- or hereafter-known methods, including saw singulation.

Figure 6:
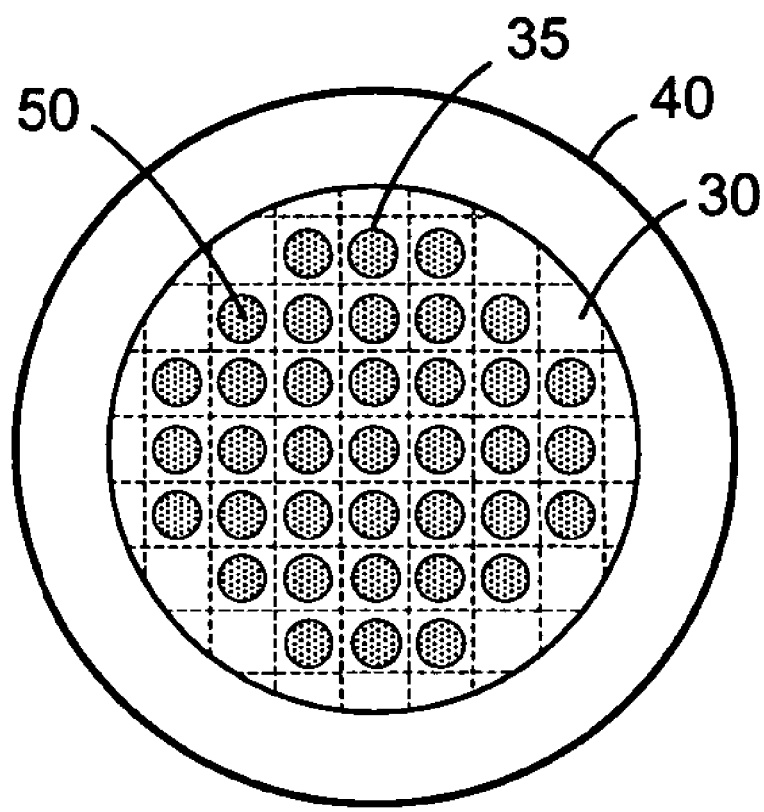
FIG. 6 is a bottom view of a handling ring and a material according to some embodiments.

FIG. 6 comprises a lower view of the FIG. 5 structure after 205 according to some embodiments. Material 30 and openings 35 defined therein are visible behind handling ring 40. A surface of semiconductor wafer 50 on which electrical devices are not fabricated is visible through openings 35. The dotted lines of FIG. 6 illustrate locations of the plurality of singulated IC die of semiconductor wafer 50.

Figure 7:
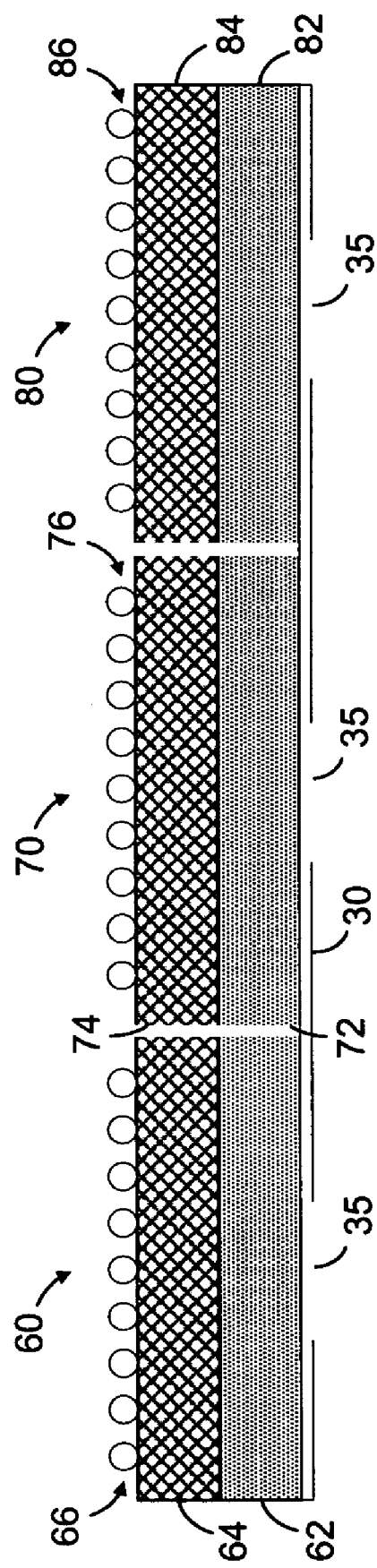
FIG. 7 is a cross-sectional side view of a plurality of integrated circuit die and a material according to some embodiments.

FIG. 7 is a side cross-sectional view of the FIG. 5 structure according to some embodiments. IC die 60, 70 and 80 are separated from one another and coupled to material 30. Each of IC die 60, 70 and 80 is disposed over a respective one of openings 35 defined by material 30. IC die 60, 70 and 80 also include IC substrate X2, electrical devices X4, and electrical contacts X6 as described above with respect to FIG. 1. IC die 60, 70 and 80 reflect a "flip-chip" arrangement because electrical devices X4 reside between IC substrate X2 and electrical contacts X6. Electrical contacts X6 may be fabricated at any time prior to 210 according to some embodiments.

In some embodiments, the plurality of IC die is formed on wafer 50 and perhaps also singulated before wafer 50 is placed on material 30. The plurality of IC die may be formed and/or singulated by an entity that is different from the entity that performs the remaining elements of process 200 and/or in a location that is different from the location in which the remaining elements of process 200 are performed.

Figure 8:
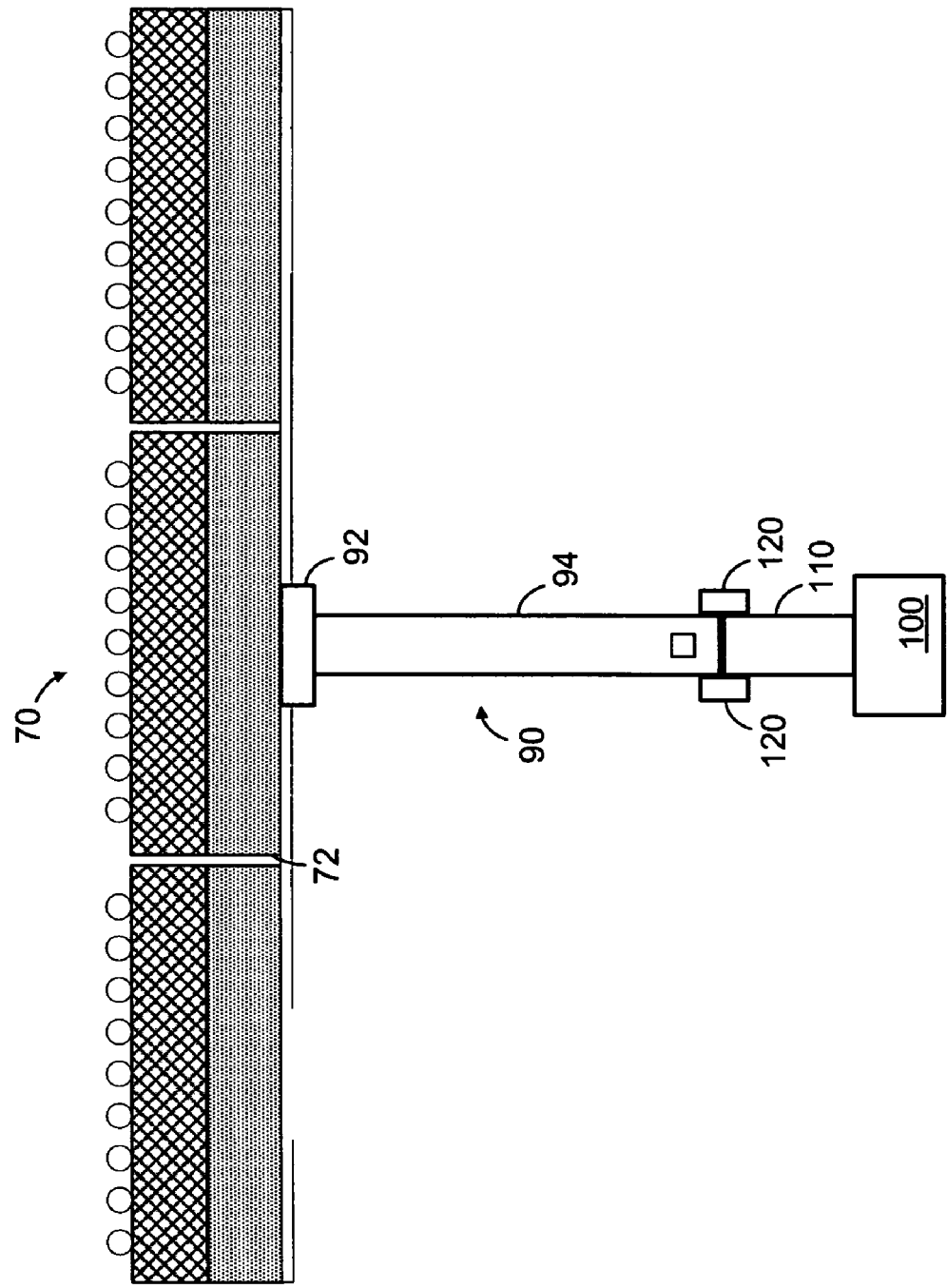
FIG. 8 is a cross-sectional side view of a plurality of integrated circuit die, a material, and a support according to some embodiments.

At 210, a support is coupled to an IC substrate of one of the plurality of IC die that was separated at 205. FIG. 8 illustrates 210 according to some embodiments, in which support 90 has moved into opening 35 defined by material 30. Structure 92 of support 90 may comprise a nozzle that creates a void between itself and IC substrate 72 when placed thereon. According to some embodiments of 210, device 100 is a pump that operates to decrease air pressure in the void after structure 92 is placed on IC substrate 72. In some embodiments, structure 92 comprises an adhesive to couple itself to IC substrate 72.

More particularly, structure 92 is coupled to extension 94 of support 90. Device 100, on the other hand, is coupled to conduit 110, which is in turn coupled to extension 94 by coupling devices 120. Elements 100, 110 and 120 may comprise elements of a device used during IC die fabrication and/or IC die packaging, as will be described below. Elements 92, 94 and 110 may be in fluid communication with one another, thereby allowing device 100 to evacuate air from the above-described void. Other systems for decreasing the air pressure in the void may be used in conjunction with some embodiments.

Figure 9:
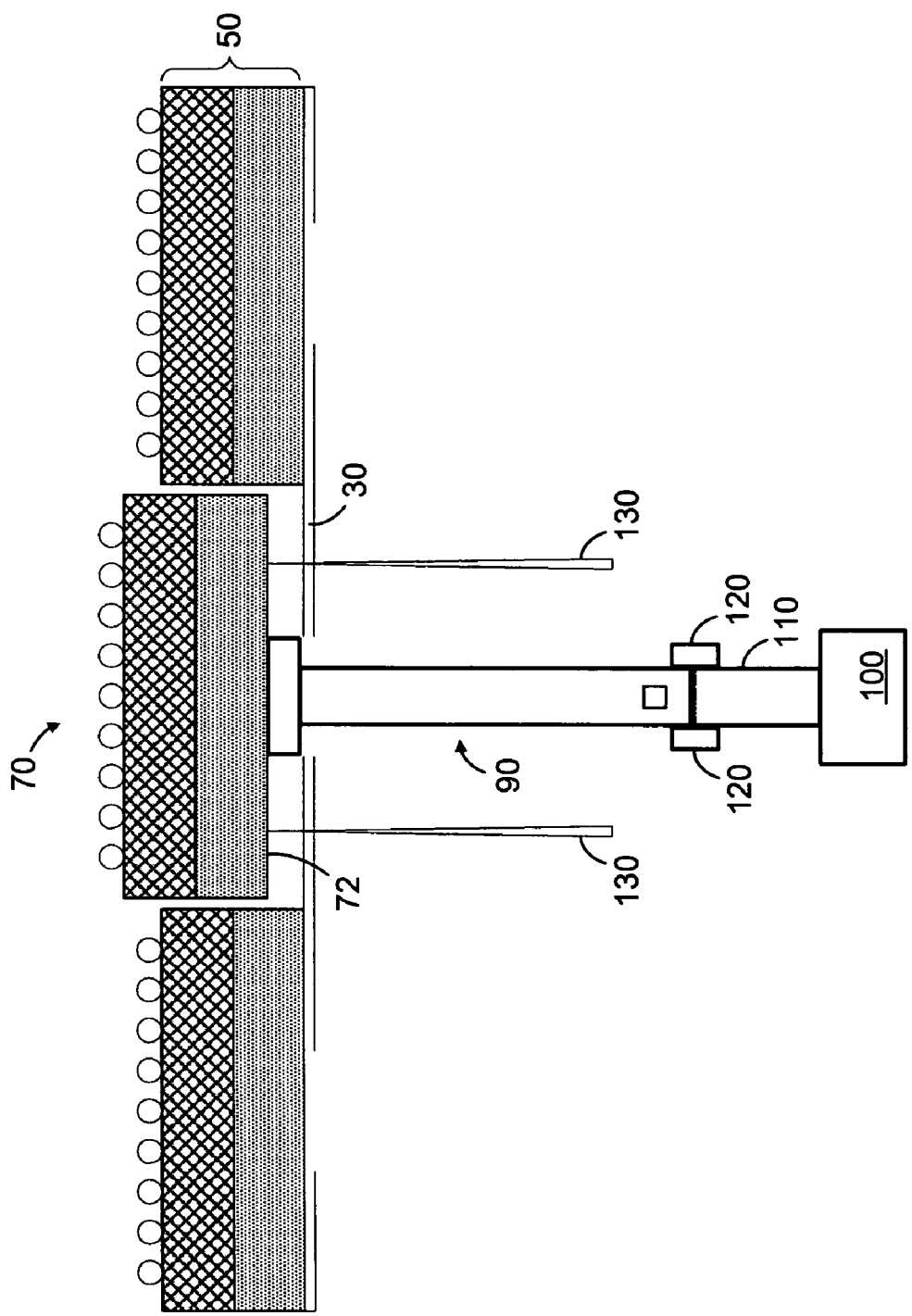
FIG. 9 is a cross-sectional side view of a plurality of integrated circuit die, a material, and a support according to some embodiments.

The one IC die is decoupled from the semiconductor wafer while the support is coupled to the IC substrate at 215. FIG. 9 illustrates an embodiment of 215 in which elements 90 through 120 are moved toward electrical contacts 76 so as to decouple IC die 70 from semiconductor wafer 50 and from material 30. As shown, support 90 remains coupled to IC substrate 72 during 215. FIG. 9 also illustrates the use of piercing tabs 130 that may assist during 215 according to some embodiments.

Figure 10:
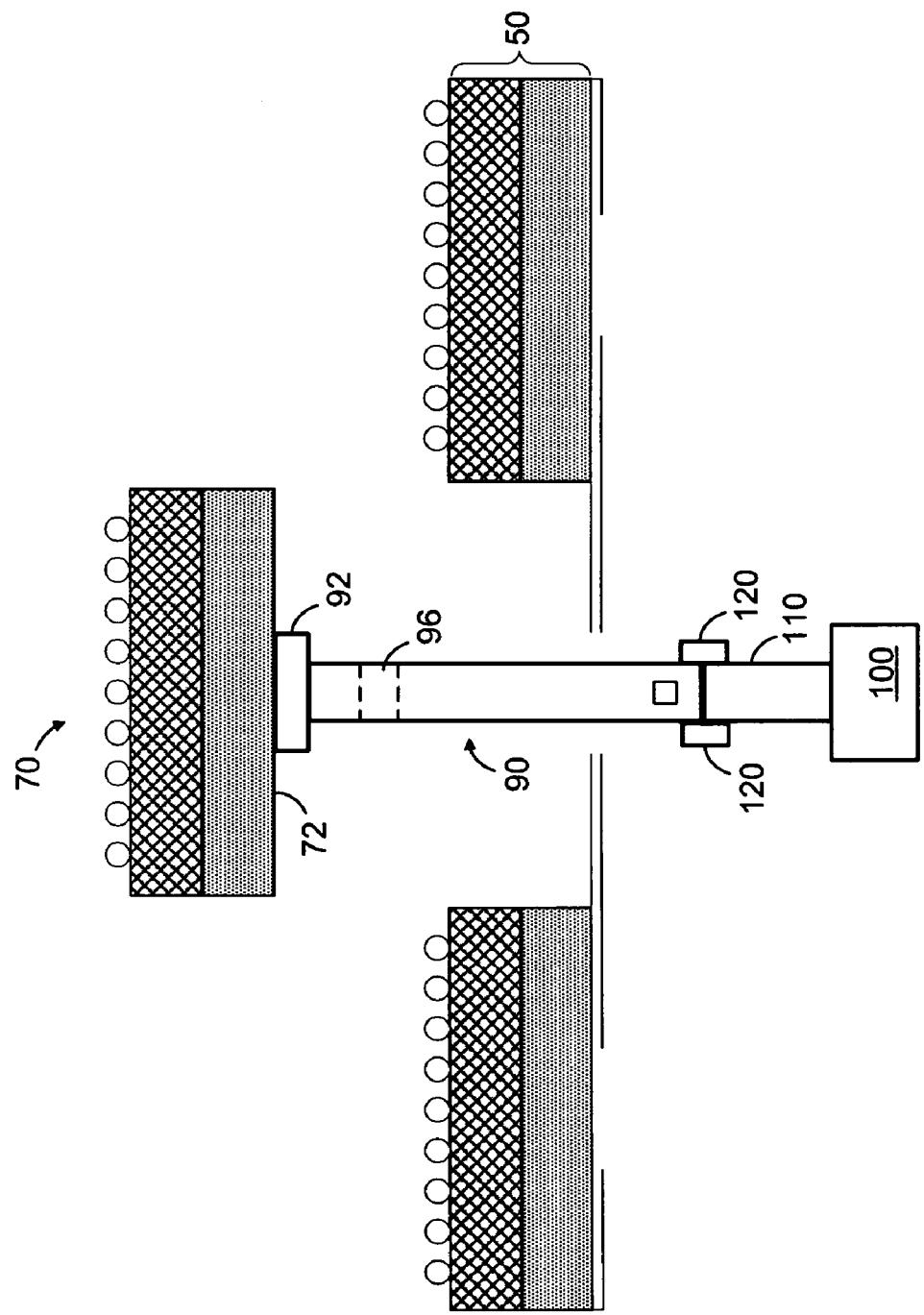
FIG. 10 is a cross-sectional side view of a plurality of integrated circuit die, a material, and a support according to some embodiments.

Next, at 220, a portion of the support is moved from a first side of the semiconductor wafer to a second side of the semiconductor wafer. The second side is a side of the semiconductor wafer in which the IC die are integrated. Some embodiments of 220 are illustrated in FIG. 10. Elements 90 through 120 are shown therein to have moved until portion 96 of support 90 has moved to a second side of wafer 50. Structure 92 remains coupled to IC substrate 72 of IC die 70.

Figure 11:
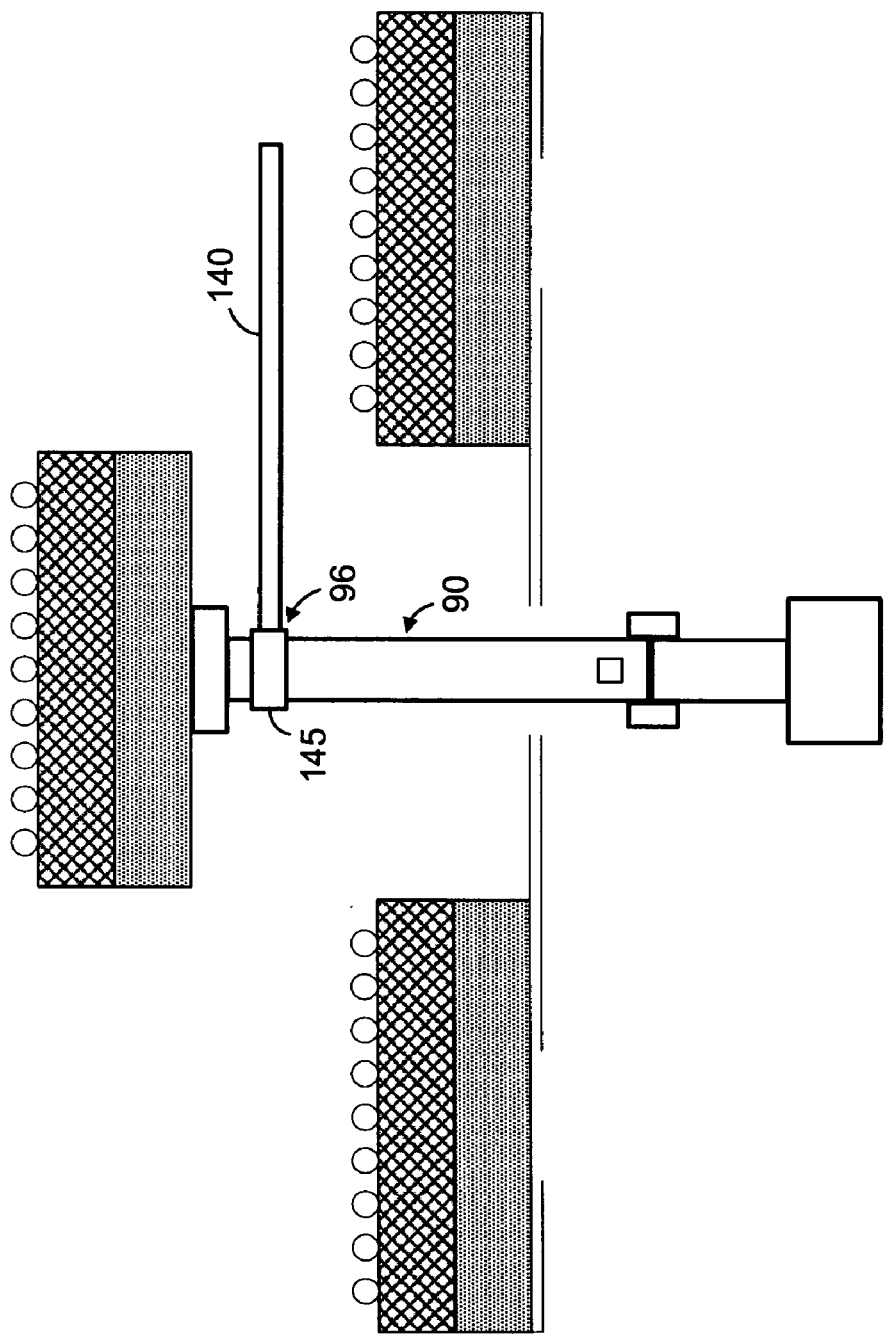
FIG. 11 is a cross-sectional side view of a plurality of integrated circuit die, a material, a support, and an arm according to some embodiments.

After the portion has moved to the second side of the semiconductor wafer, the portion is secured at 225. FIG. 11 illustrates embodiments of 225 in which arm 140 has secured portion 96 of support 90. Arm 140 may include clamp 145 or any other system to secure portion 96. Arm 140 may be an element of a fabricating and/or packaging system of which device 100, conduit 110 and coupling devices 120 are also elements.

Figure 12:
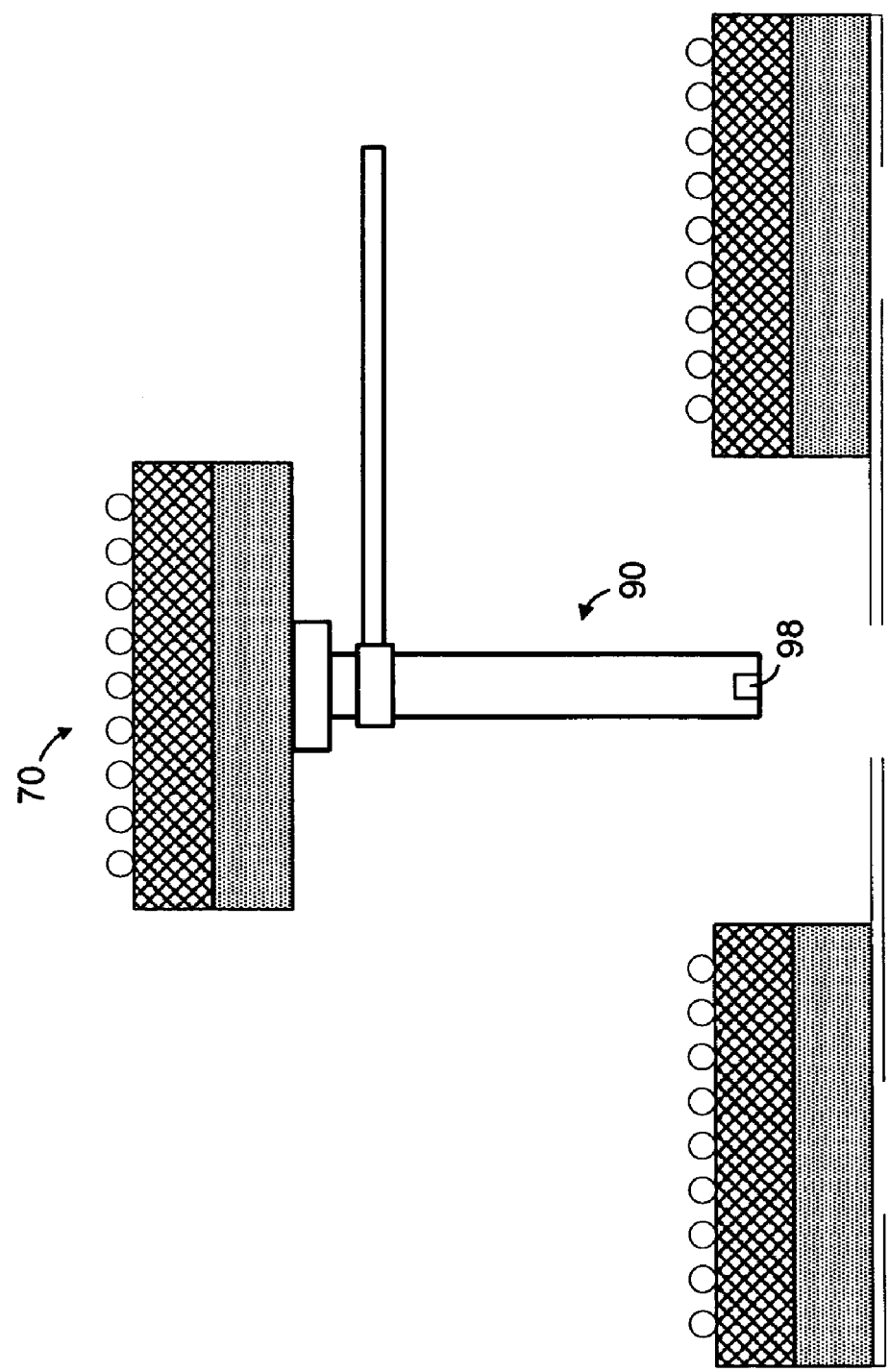
FIG. 12 is a cross-sectional side view of a plurality of integrated circuit die, a material, a support, and an arm according to some embodiments.

As shown in FIG. 12, arm 140 may lift support 90 and IC die 70 until portion 90 passes completely through opening 35. Also shown in FIG. 12 is valve 98, which may be sealed prior to uncoupling extension 94 from conduit 110. Valve 98 may therefore maintain decreased air pressure within the above-described void after support 90 is detached from elements 100 through 120. In some embodiments, valve 98 is sealed and support 90 is detached from elements 100 through 120 during 215.

A second portion of the support is then moved through an opening of a storage device at 230. According to some embodiments, the storage device comprises a tape and reel device such as storage device 150 of FIG. 13. Storage device 150 defines storage position 152 and opening 154. In the illustrated embodiment, storage device 150 also comprises adhesive material 156. Other storage devices, including but not limited to waffle packs, may be used in conjunction with some embodiments.

Figure 13:
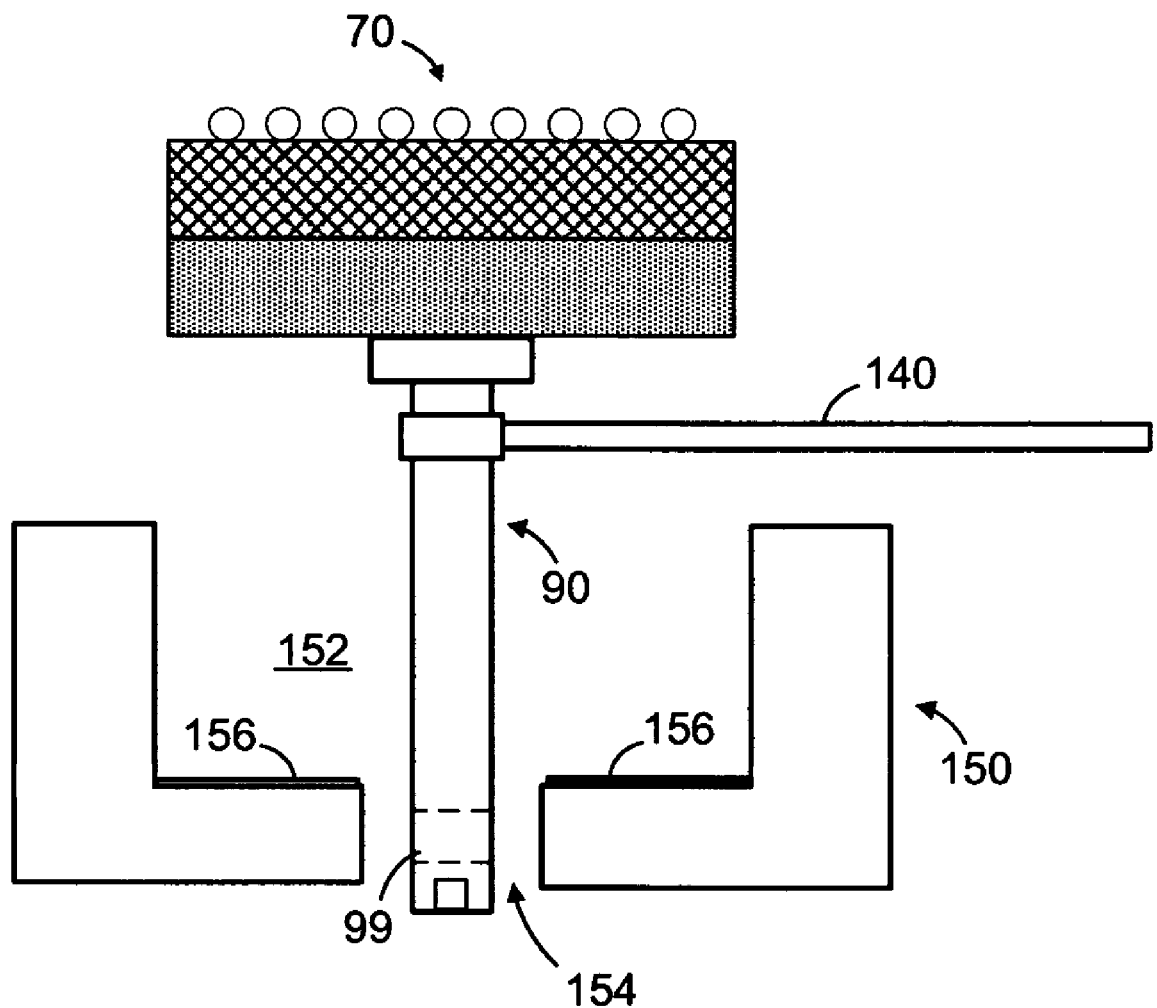
FIG. 13 is a cross-sectional side view of an integrated circuit die, a support, an arm, and a storage device according to some embodiments.
Figure 14:
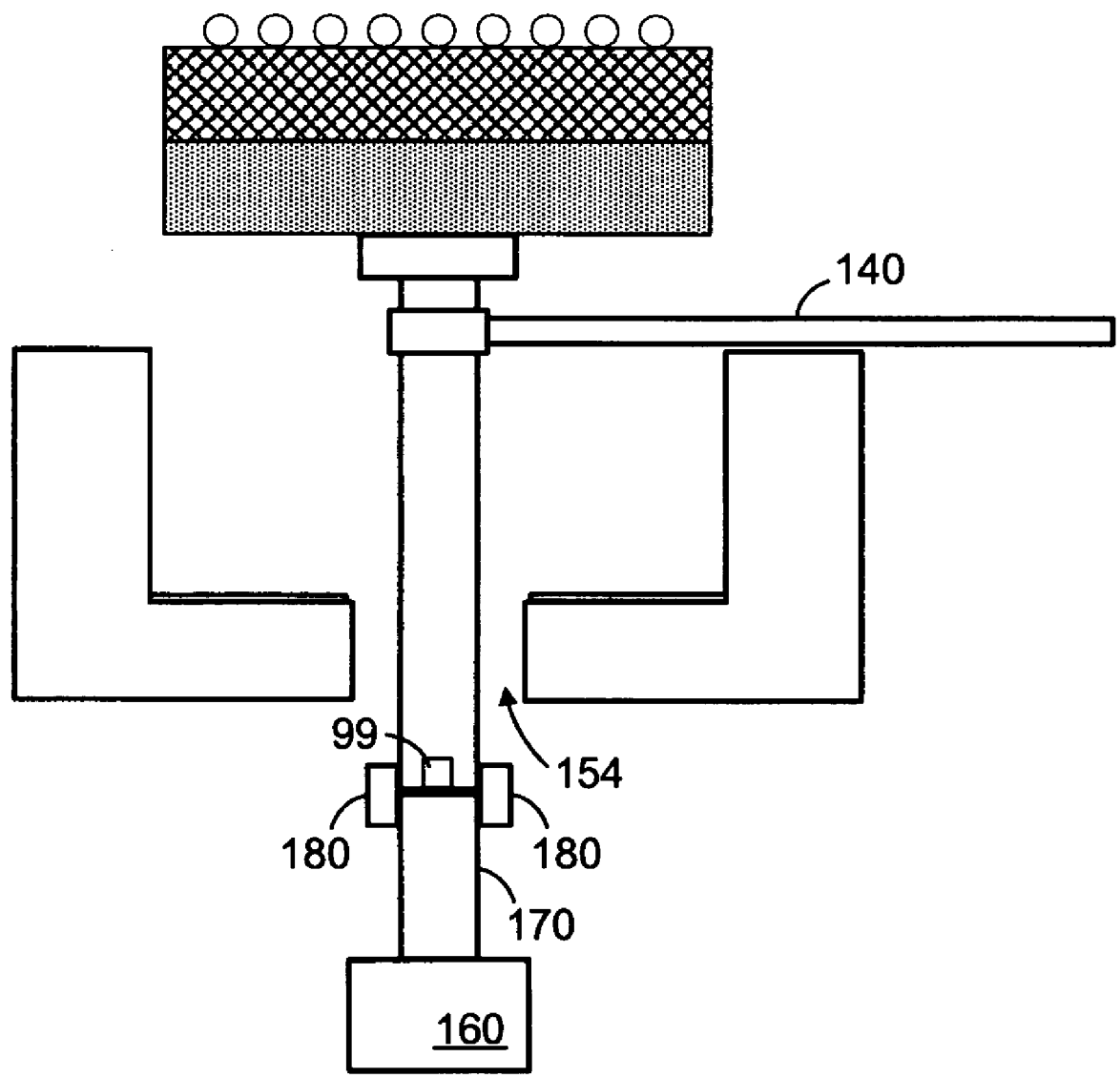
FIG. 14 is a cross-sectional side view of an integrated circuit die, a support, an arm, and a storage device according to some embodiments.

Second portion 99 of support 90 is shown in FIG. 13 moving through opening 154. The second portion is secured at 240. As illustrated in FIG. 14, arm 140 may move second portion 99 completely through opening 154. Second portion 99 is then secured by elements 160, 170 and 180, which may correspond to respective ones of elements 100, 110 and 120. Any other elements capable of performing the functions attributed herein to elements 160, 170 and 180 may be used in conjunction with some embodiments.

Figure 15:
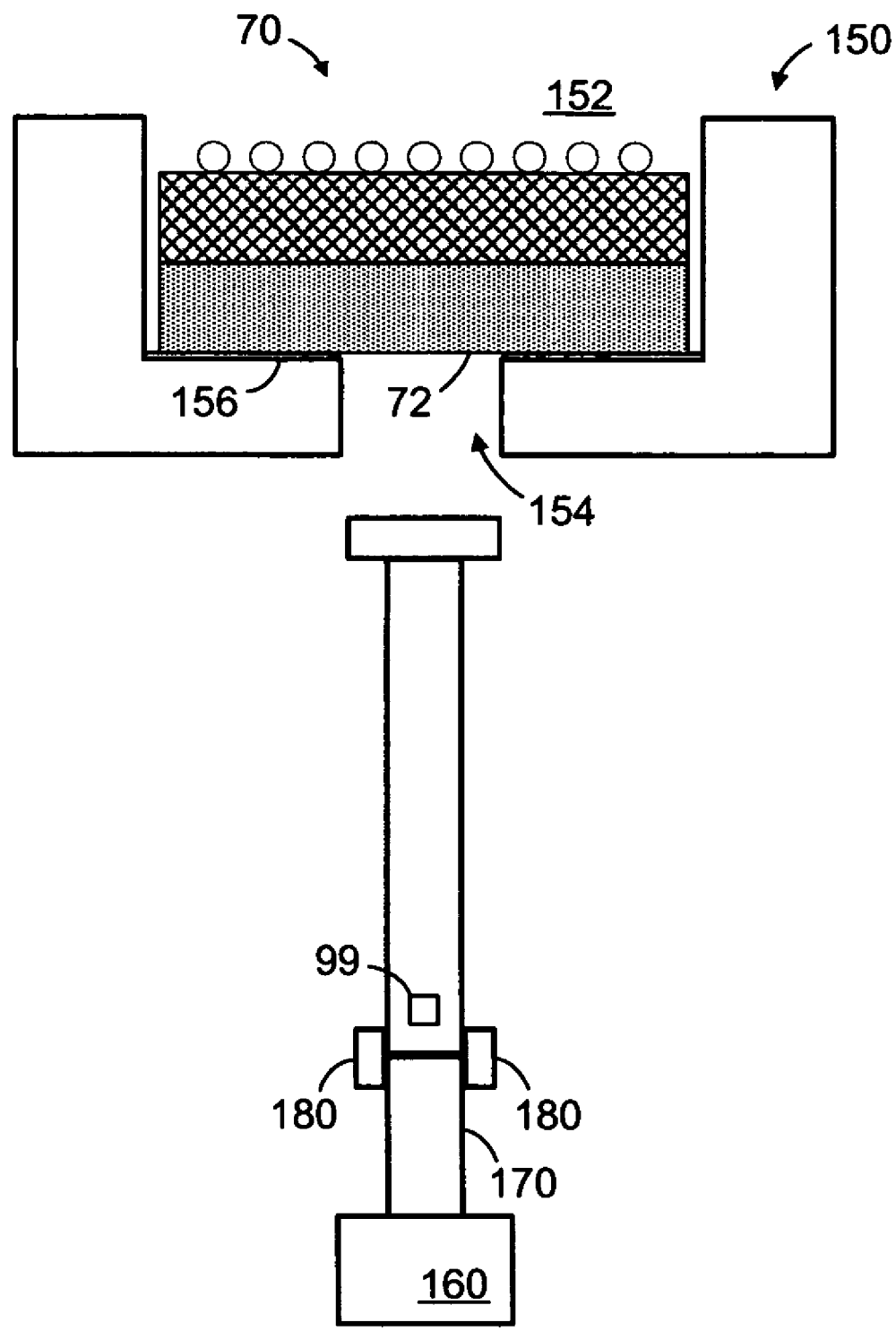
FIG. 15 is a cross-sectional side view of an integrated circuit die, a support, and a storage device according to some embodiments.

The first portion of the support is released at 245, the support is moved to dispose the IC die in a storage position within the storage device at 250, and the support is decoupled from the IC substrate at 255. Continuing with the present example, arm 140 may release portion 98 at 245, support 90 may move downward through opening 154 at 250 until IC die 70 is disposed in storage position 152 and seated on adhesive material 156 of storage device 150, and support 90 may be decoupled from IC substrate 72. FIG. 15 shows storage device 150 and IC die 70 after support 90 is decoupled from IC substrate 72 according to some embodiments. Such decoupling may include opening valve 99 to increase air pressure within the void defined by structure 92 and IC substrate 72.

Figure 16:
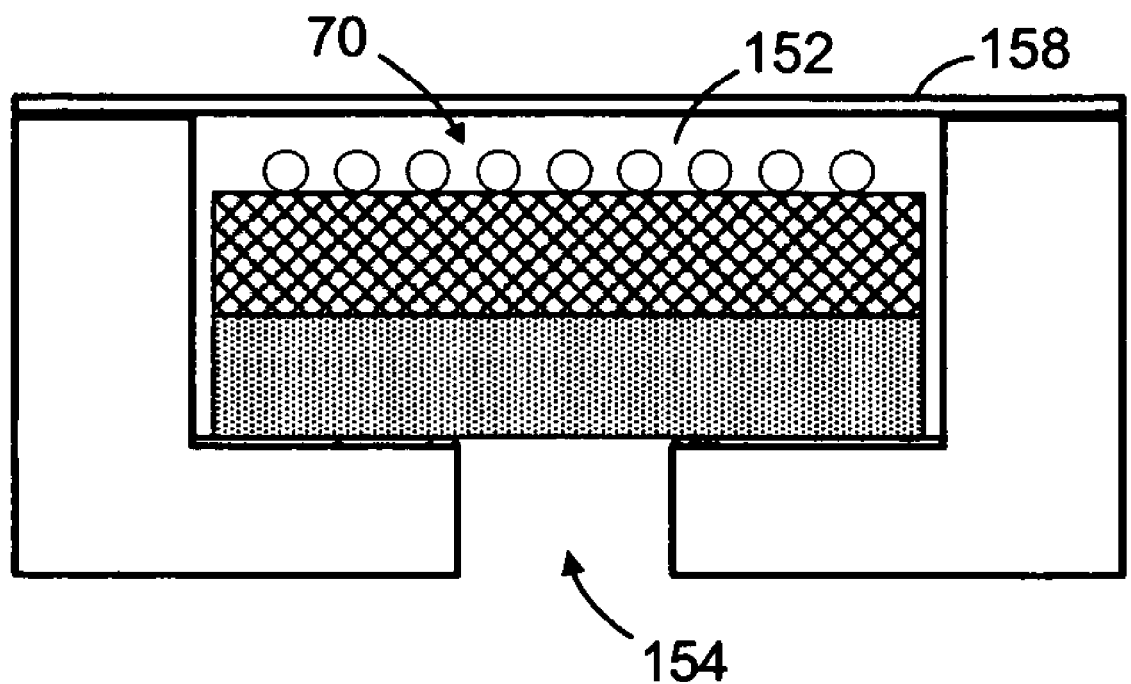
FIG. 16 is a cross-sectional side view of an integrated circuit die and a storage device according to some embodiments.

FIG. 16 shows cover 158 that may be placed over storage position 152 after 255. Cover 158 may provide secure transport of IC die 70 within storage device 150. According to some embodiments, opening 154 is sealed prior to such transport.

Figure 17:
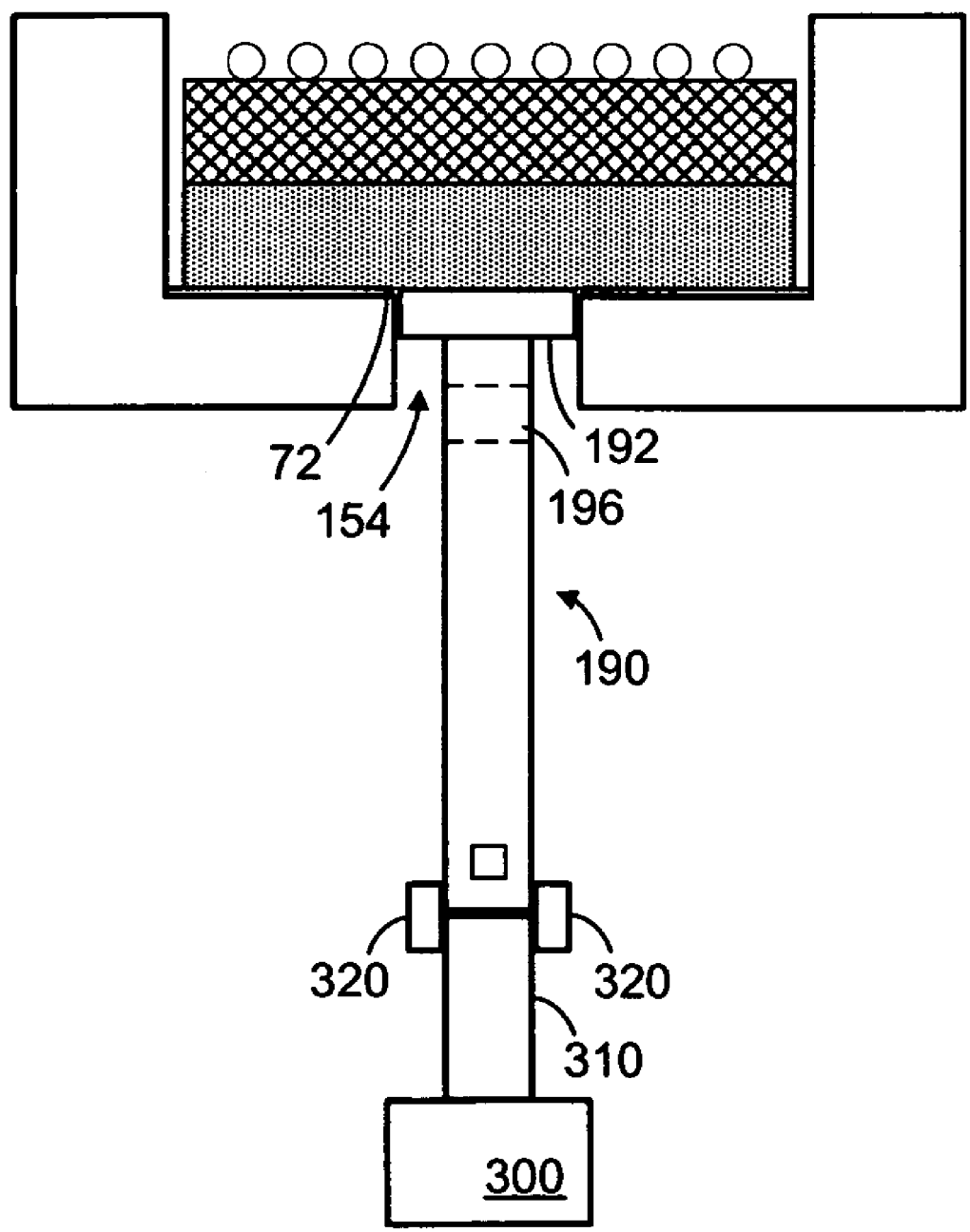
FIG. 17 is a cross-sectional side view of an integrated circuit die, a support, and a storage device according to some embodiments.

Returning again to process 200, a first portion of a second support is moved through the opening of the storage device at 260 while the support is coupled to the IC substrate. FIG. 17 illustrates 260 according to some embodiments, in which support 190 has moved into opening 154. Support 190 may comprise an element of an IC package fabrication device. Support 190 may be located remote from support 90.

Support 190 includes structure 192 for coupling support 190 to IC substrate 72. Structure 192 may comprise a nozzle that creates a void between itself and IC substrate 72 when placed thereon. Device 300 may comprise a pump that operates in conjunction with conduit 310 and coupling devices 320 to decrease air pressure in the void after structure 192 is placed on IC substrate 72. Any other elements capable of performing the functions attributed herein to elements 300 through 320 may be used in conjunction with some embodiments.

Figure 18:
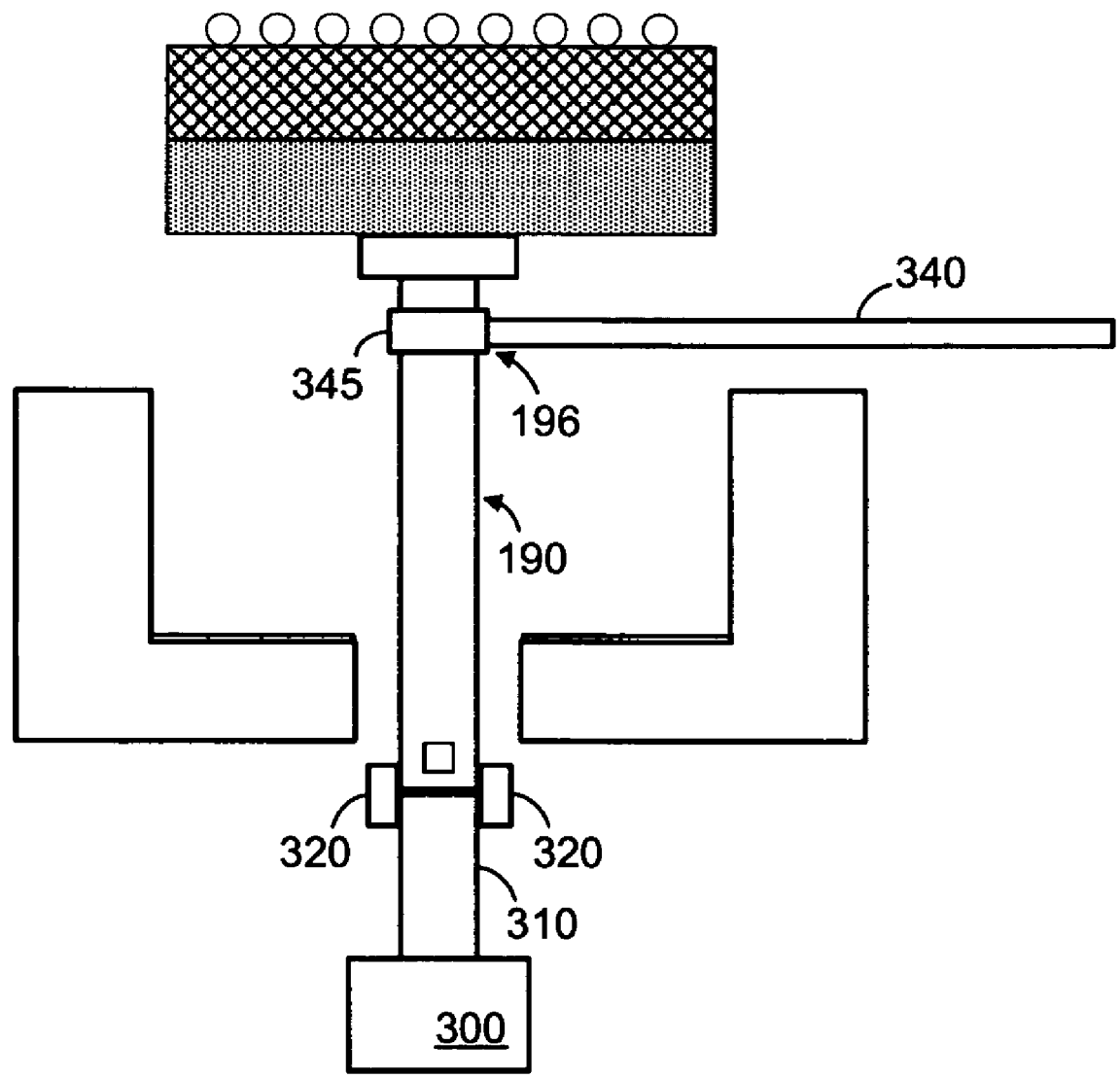
FIG. 18 is a cross-sectional side view of an integrated circuit die, a support, an arm, and a storage device according to some embodiments.

According to some embodiments of 260, portion 196 of support 190 is moved through opening 154 to the position shown in FIG. 18. Next, at 265, the first portion of the second support is secured. FIG. 18 also shows arm 340 having secured portion 196 of support 190. Arm 340 may include clamp 345 or any other system to secure portion 196. Arm 340 may be an element of a fabricating and/or packaging system to which elements 190 and 300 through 320 also belong.

Figure 19:
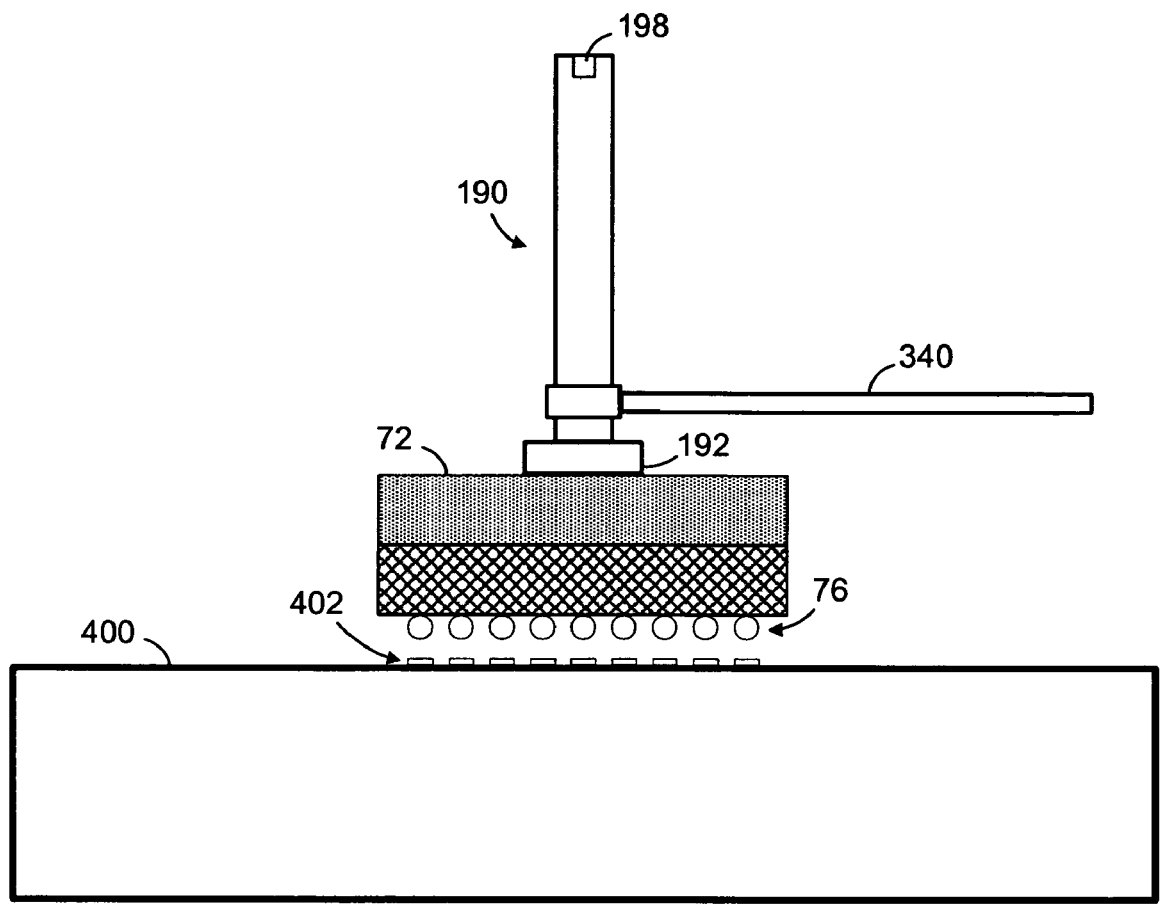
FIG. 19 is a side view of an integrated circuit die, a support, an arm, and a portion of an integrated circuit package according to some embodiments.

At 270, the second support is moved while the first portion is secured in order to place electrical contacts of the IC die onto corresponding electrical contacts of an IC package. FIG. 19 illustrates some embodiments of 270, in which arm 340 has inverted support 190 and aligned electrical contacts 76 with corresponding electrical contacts 402 of IC package 400. In the illustrated embodiment, valve 198 was closed prior to decoupling support 190 from elements 300 through 320 in order to maintain negative pressure within the void formed by structure 192 and IC substrate 72. Support 190 then continues to move until electrical contacts 76 engage corresponding ones of electrical contacts 402.

According to some embodiments, arm 340 passes support 190 to conventional chip placement equipment after 265 and prior to 270. In some embodiments, electrical contacts 76 and 402 are cleaned and/or underfill material is dispensed on electrical contacts 402 prior to their engagement.

Next, at 275, the second support is decoupled from the IC substrate. Decoupling may comprise opening valve 198 to increase air pressure within the above-described void. Support 190 and arm 340 may then be moved away to result in the system illustrated in FIG. 1 and described above. According to some embodiments, further processing is applied to the system in order to fuse the electrical contacts of the IC die with respective electrical contacts of the IC package and to encase the system in a protective enclosure.

Elements 260 through 275 of process 200 may occur at a different location and may be performed by a different entity than elements 205 through 255. For example, elements 205 through 255 may be performed by an IC die manufacturer at a die fabrication facility, and elements 260 through 275 may be performed by an IC package manufacturer at a package fabrication facility. According to some embodiments, the entirety of process 200 is performed by a same entity and/or at a same general location.

The several embodiments described herein are solely for the purpose of illustration. The various features described herein need not all be used together, and any one or more of those features may be incorporated in a single embodiment. Some embodiments may include any currently or hereafter-known versions of the elements described herein. Therefore, persons skilled in the art will recognize from this description that other embodiments may be practiced with various modifications and alterations.

What is claimed is:

1. A method comprising:
   singulating a semiconductor wafer to separate a plurality of integrated circuit die that are integrated into the semiconductor wafer;
   coupling a support to an integrated circuit substrate of one of the plurality of integrated circuit die;
   decoupling the one integrated circuit die from the singulated semiconductor wafer while the support is coupled to the integrated circuit substrate;
   moving a portion of the support from a first side of the semiconductor wafer to a second side of the semiconductor wafer, the plurality of integrated circuit die being integrated into the second side of the semiconductor wafer; and
   securing the portion of the support after the portion of the support has been moved to the second side of the semiconductor wafer;
   moving a second portion of the support through an opening of a storage device;
   securing the second portion of the support;
   releasing the first portion of the support;
   moving the support until the one integrated circuit die is disposed in a storage position within the storage device; and
   decoupling the support from the integrated circuit substrate of the one integrated circuit die.

2. A method according to claim 1, wherein a second side of the one integrated circuit die is not touched during the coupling and the decoupling, the second side being opposite to the integrated circuit substrate.

3. A method according to claim 2, wherein the one integrated circuit die comprises a flip-chip.

4. A method according to claim 1, wherein coupling the support to the integrated circuit substrate comprises:
   placing a structure of the support on the integrated circuit substrate to create a void defined by the structure and by the integrated circuit substrate; and
   decreasing air pressure within the void, and wherein decoupling the support from the integrated circuit substrate comprises increasing the air pressure within the void.

5. A system comprising:
a semiconductor wafer comprising a plurality of singulated integrated circuit die;
a support to couple to an integrated circuit substrate of one of the plurality of integrated circuit die and to decouple the one integrated circuit die from the semiconductor wafer while the support is coupled to the integrated circuit substrate;
an arm to secure a portion of the support after the portion of the support has moved from a first side of the semiconductor wafer to a second side of the semiconductor wafer, the plurality of integrated circuit die being integrated into the second side of the semiconductor wafer;
a storage device defining an opening to pass a second portion of the support and a storage position to receive the one integrated circuit die; and
a second arm to secure the second portion of the support and to move, after the arm releases the first portion of the support, the support to dispose the one integrated circuit die in the storage position.

6. A system according to claim 5, wherein a second side of the one integrated circuit die is not touched during the coupling and the decoupling, the second side being opposite to the integrated circuit substrate.

7. A system according to claim 6, wherein the one integrated circuit die comprises a flip-chip.

8. A system according to claim 5, the support comprising:
a structure to create void defined by the structure and by the integrated circuit substrate; and
a device to decrease air pressure within the void to couple the support to the integrated circuit substrate, and to increase air pressure within the void to decouple the support from the integrated circuit substrate.

9. A system according to claim 5, further comprising:
a second support to move into the opening of the storage device to couple the second support to the integrated circuit substrate;
a third arm to secure a first portion of the second support that has moved through the opening while the second support is coupled to the integrated circuit substrate; and
an integrated circuit package comprising electrical contacts,
wherein the third arm is to move the second support while securing the first portion of the second support so as to place electrical contacts of the one integrated circuit die onto corresponding ones of the electrical contacts of the integrated circuit package.

10. A system comprising:
a semiconductor wafer comprising a plurality of singulated microprocessors;
a support to couple to an integrated circuit substrate of one of the plurality of microprocessors and to decouple the one microprocessor from the semiconductor wafer while the support is coupled to the integrated circuit substrate;
an arm to secure a portion of the support after the portion of the support has moved from a first side of the semiconductor wafer to a second side of the semiconductor wafer, the plurality of microprocessors being integrated into the second side of the semiconductor wafer
a storage device defining an opening to pass a second portion of the support and a storage position to receive the one microprocessor; and
a second arm to secure the second portion of the support and to move, after the arm releases the first portion of the support, the support to dispose the one microprocessor in the storage position.

11. A system according to claim 10, wherein a second side of the one microprocessor is not touched during the coupling and the decoupling, the second side being opposite to the integrated circuit substrate.

12. A system according to claim 10, the support comprising:
a structure to create a void defined by the structure and by the integrated circuit substrate; and
a device to decrease air pressure within the void to couple the support to the integrated circuit substrate, and to increase air pressure within the void to decouple the support from the integrated circuit substrate.

* * * * *